United States Patent [19]

Yasuhira et al.

[11] Patent Number: 5,047,815
[45] Date of Patent: Sep. 10, 1991

[54] SEMICONDUCTOR MEMORY DEVICE HAVING A TRENCH-STACKED CAPACITOR

[75] Inventors: Mitsuo Yasuhira, Ikeda; Takatoshi Yasui, Higashiosaka; Kazuhiro Matsuyama, Neyagawa; Hideyuki Iwata, Hirakata; Masanori Fukumoto, Osaka, all of Japan

[73] Assignee: Matsushita Electric Industrial Co., Ltd., Osaka, Japan

[21] Appl. No.: 394,123

[22] Filed: Aug. 14, 1989

[30] Foreign Application Priority Data

Aug. 18, 1988 [JP] Japan .............................. 63-205141
Dec. 13, 1988 [JP] Japan .............................. 63-314037

[51] Int. Cl.$^5$ ............................................ H01L 29/68
[52] U.S. Cl. .................................... 357/23.6; 357/51; 357/55
[58] Field of Search .............. 357/23.6, 55, 51, 54, 357/23.6 G

[56] References Cited

U.S. PATENT DOCUMENTS 4,873,560 10/1989 Sunami et al. .................. 357/23.6
4,918,502 4/1990 Kaga et al. ...................... 357/23.6

FOREIGN PATENT DOCUMENTS 60-239053 11/1985 Japan .............................. 357/23.6
61-36965  2/1986 Japan .............................. 357/23.6
61-56445  3/1986 Japan .............................. 357/23.6
62-79659  4/1987 Japan .............................. 357/23.6
63-241961 10/1988 Japan .............................. 357/23.6
63-278268 11/1988 Japan .............................. 357/23.6

OTHER PUBLICATIONS

Kaga et al., "Half-Vcc Sheath-Plate Capacitor DRAM Cell with Self-Aligned Buried Plate Wiring", Aug 1988, *IEEE Transactions on Electron Devices*, pp. 1257-1263.

Shigeru Nakajima, "An Isolation-Merged Verticle Capacitor Cell for Large Capacity DRAM" IEDM Technical Digest 1984 pp. 240-243.

*Primary Examiner*—Andrew J. James
*Assistant Examiner*—Courtney A. Bowers
*Attorney, Agent, or Firm*—Stevens, Davis, Miller & Mosher

[57] ABSTRACT

A semiconductor memory device includes a capacitor and an insulating separation area in a trench formed around a switching transistor, with a storage electrode of the capacitor being sandwiched between an upper and a lower cell plate electrode to reduce leakage current due to the parasitic MOS transistor effect in the trench sidewall along the channel in the switching transistor and leakage current due to the gate-controlled diode effect in the trench sidewall. Also, a method is disclosed for manufacturing such semiconductor memory device.

4 Claims, 10 Drawing Sheets

SEMICONDUCTOR MEMORY DEVICE HAVING A TRENCH-STACKED CAPACITOR

BACKGROUND OF THE INVENTION

The present invention relates to a semiconductor memory device and methods of manufacturing same.

A one transistor-one capacitor memory cell including a single switching transistor and a single capacitor and used as a memory cell for a high-density DRAM is widely used because it includes few components and has a cell area which is easily miniaturized.

In particular, the miniaturization of the cell area is effected by forming a trench in the semiconductor substrate, forming a switching transistor in an island area surrounded by the trench, and using the trench side as a capacitor, as disclosed in FIGS. 1 and 2 which show a conventional semiconductor memory device as illustrated in a publication by Shigeru Nakajima et al, "An Isolation-Merged Vertical Capacitor Cell for Large Capacity DRAM", *IEDM TECHNICAL DIGEST*, 1984, pp. 240-243.)

FIG. 1 is a schematic plan view of a conventional memory cell. FIG. 2 is a schematic cross section view of the conventional memory cell taken along the line I-I' of FIG. 1. For convenience of explanation, the same components are given the same reference numeral in FIGS. 1 and 2. Reference numeral 101 denotes a p-type semiconductor substrate; 102, an $n^+$-type impurity layer forming the drain of a switching transistor; 103, an $n^+$-type impurity layer forming the source of the switching transistor; 104, a gate insulating film; 105, a word line; 106, a bit line; 107, a bit line comprising a contact window between the bit line and drain; 110, a trench formed around the switching transistor; 111, an insulating film formed inside the trench 110; 112, a storage electrode of poly-silicon which electrically connects the source 103 and a window 113; 114, a capacitor insulating film formed on the storage electrode 112; 115, a plate electrode forming a memory cell capacitor together with the storage electrode 112 and capacitor insulating film 114; 116, an isolated oxidation film obtained by oxidizing an upper portion of the poly-silicon forming the plate electrode 115 in the trench; and 117, an inter-layer insulating film.

In the arrangement in which the periphery of the island in which the switching transistor is formed is used as both the capacitor and isolated insulating area of the memory cell, however, there would occur a leak current in the switching transistor due to the parasitic MOSFET effect and a leak current in the cell capacitor due to the gate controlled diode effect in the trench sidewall of the cell capacitor.

As shown in FIG. 3, since the poly-silicon composing the storage electrode 112 is buried around the switching transistor, a parasitic MOSFET transistor is formed in the trench sidewall along the channel of the switching transistor. The storage electrode 112 acts effectively as a gate electrode in the trench sidewall to control the flow of an electric current through the source-drain of the switching transistor, separately from a regular word line. Therefore, when the voltage level of the storage electrode 112 changes to high (for example, to Vcc), a leak current is produced flowing through the source-drain of the switching transistor.

A gate controlled diode structure is formed on the trench sidewall out of the storage electrode 112, the sidewall insulating film 111, and the source 103 of the switching transistor. Therefore, the voltage level of the storage electrode changes from 0 V to Vcc, a depletion layer extends to the trench sidewall due to the gate controlled diode effect, and a leak current is produced due to a defect in the oxide film-Si interface on the trench sidewall.

In summary, the problems to be solved are as follows:
(1) To prevent the generation of a leak current due to parasitic MOS transistor effect on the sidewall of a trench formed in the isolation region along the channel in an isolation-merged memory cell which uses the trenched isolation region around the switching transistor as a memory cell capacitor;
(2) To prevent the generation of a gate controlled diode leak current between the source of the switching transistor and the substrate on the trench sidewall.

SUMMARY OF THE INVENTION

It is an object of the present invention, in an isolation-merged memory cell using a trench structure in its cell capacitor,
(1) to prevent the generation of a leak current due to parasitic MOS transistor effect on the trench sidewall along the channel in the switching transistor; and
(2) to prevent the generation of a gate controlled diode leak current between the source of the switching transistor and the substrate on the trench sidewall.

In order to achieve the above object, according to the present invention, a first cell plate electrode is provided in the trench, a charge storage electrode is formed over the first cell plate electrode, a second cell plate electrode is provided over the charge storage electrode such that the charge storage electrode is sandwiched between the first and second cell plate electrodes, the first and second cell plate electrodes are connected to one another, and an insulator is provided as an isolation region on the cell plate electrodes and charge storage electrode.

Since the charge storage electrode is buried between the cell plate electrodes and the trench sidewall opposes the cell plate electrodes by which the voltage level is clamped, the surface potential of the semiconductor substrate constituting the trench sidewall is fixed to thereby suppress the generation of a gate controlled diode leak current.

Since the periphery of the switching transistor is completely isolated by the insulator buried in the trench, no leak current due to parasitic MOS transistor effect on the trench sidewall along the channel is produced.

BRIEF DESCRIPTION OF THE DRAWINGS

FIGS. 4 and 5 illustrate a first embodiment of the present invention, wherein FIG. 4 is a schematic plan view of a unit cell and FIG. 5 is a cross section view taken along the line I-I' of FIG. 4;

DESCRIPTION OF THE INVENTION

Figure 1:
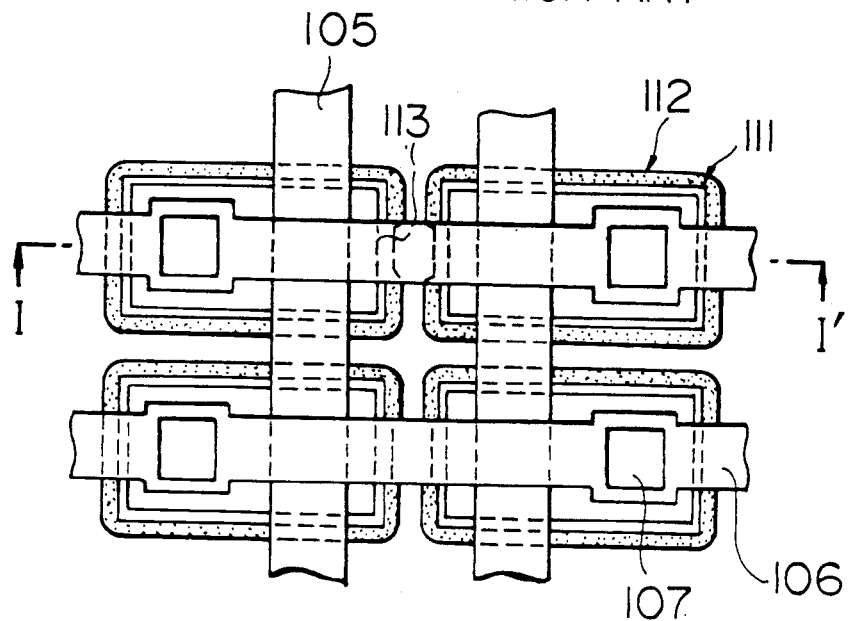
FIG. 1 is a schematic plan view of a conventional memory cell.
Figure 2:
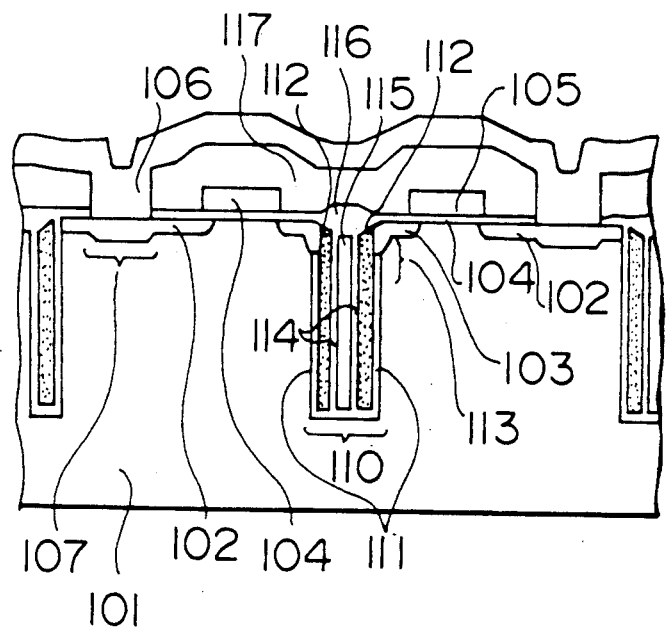
FIG. 2 is a schematic cross section view of the memory cell taken along the line I-I' of FIG. 1.
Figure 3:
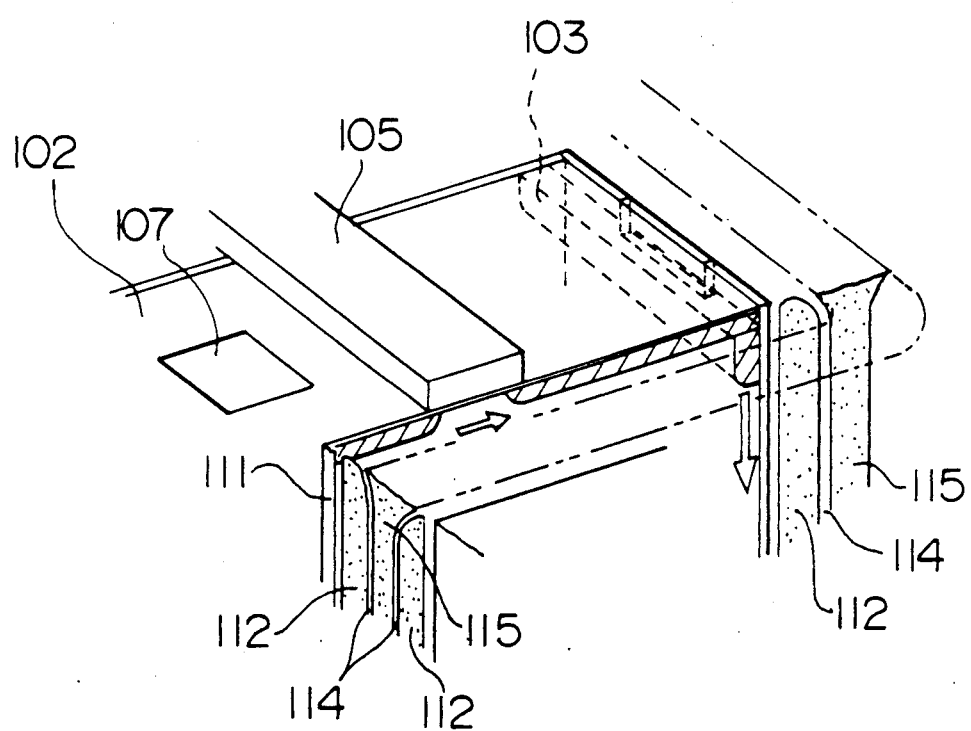
FIG. 3 schematically illustrates the generation of a leak current due to the parasitic MOS transistor effect and gate controlled diode structure of the conventional memory cell.
Figure 4:
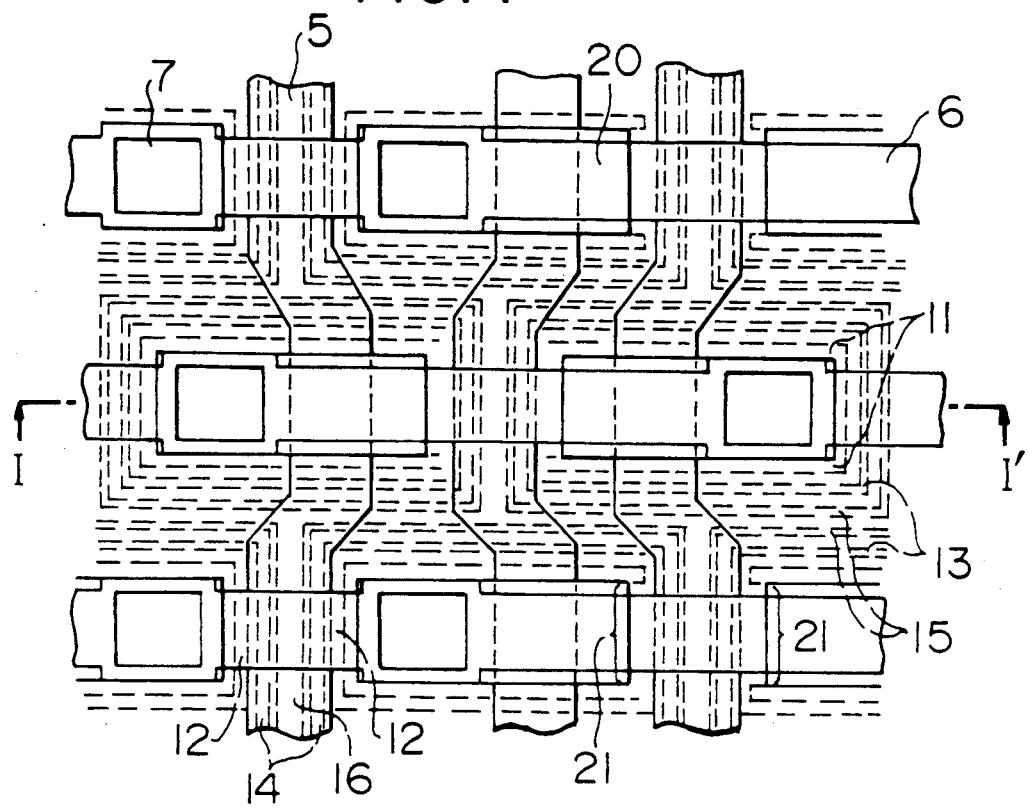
Figure 5:
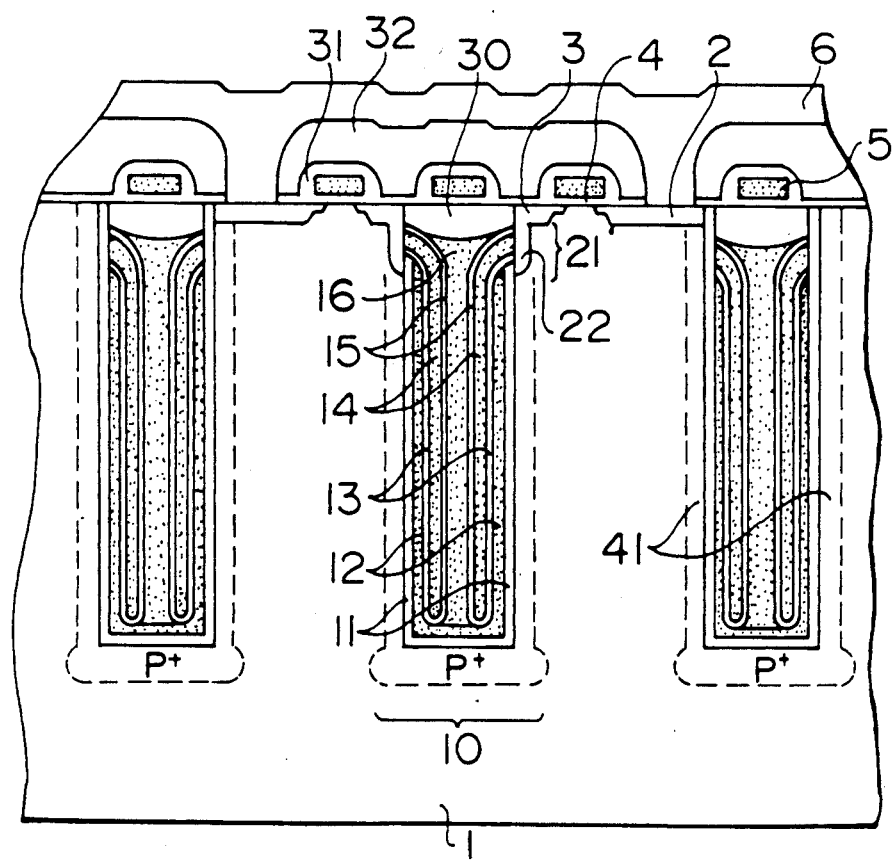

FIGS. 4 and 5 show one embodiment of the present invention. FIG. 4 schematically illustrates, in a plan view, the structure of a memory cell array of the embodiment of the present invention. FIG. 5 is a cross section view taken along the line I–I' of FIG. 4. For convenience of explanation, the same components are given the same reference numeral in FIGS. 4 and 5.

Reference numeral 1 denotes a p-type semiconductor substrate; 2, an $n^+$-type impurity layer forming the drain of a switching transistor; 3, an $n^+$-type impurity layer forming the source of the transistor; 4, a gate insulating film; 5, a word line, for example, of a poly-silicon or poly-cide; 6, a bit line, for example, of aluminum and electrically connected via a contact window 7 with the drain 2. The switching transistor is formed in an island area 20. Reference numeral 11 denotes an insulating film formed on the inner sidewall and bottom of the trench 10; 12, a cell plate electrode which may be formed of poly-silicon; 13, a capacitor insulating film formed on the cell plate electrode 12; and 14, a storage electrode, which may be poly-silicon, formed on the capacitor insulating film 13. The storage electrode 14 is connected with an $n^+$-diffusion layer 22 of the trench 10 sidewall in a source connection area 21 and electrically connected with the source 3 of the transistor as a result. Reference numeral 15 denotes a capacitor insulating film formed on the storage electrode 14; 16, a cell plate electrode, which may be made of poly-silicon, formed on the capacitor insulating film 15; 30, an insulating film overlying the cell plate electrode 16 in the trench 10 and acting as an isolation region for the adjacent switching transistor; 31, an insulating film; 32, an inter-insulating film; and 41, an inpurity diffusion area of the same conductivity type as the substrate 1 and of higher concentration than the substrate.

Figure 6:
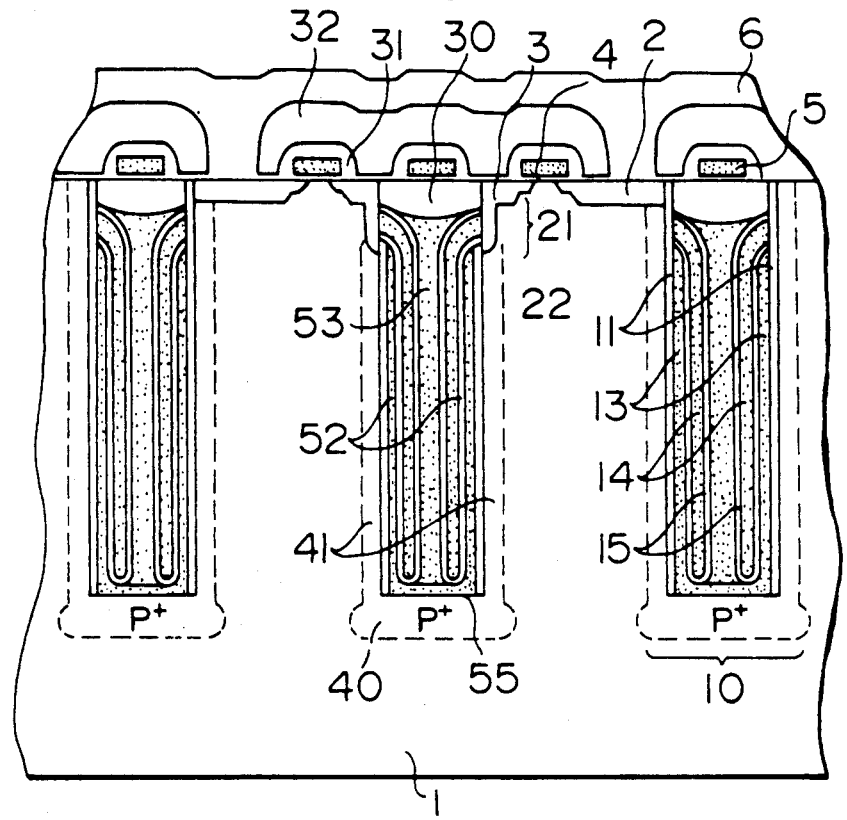
FIG. 6 is a schematic cross section view of a unit cell showing a second embodiment of the present invention.

FIG. 6 shows a schematic cross section structure of an unit memory cell showing a second embodiment of the present invention. Reference numeral 52 denotes a cell plate electrode of poly-silicon in which impurities of the same conductivity type as the substrate 1 are diffused; and 53, a cell plate electrode of poly-silicon in which impurities of the same conductivity type as the substrate 1 are diffused. The cell plate electrode 52 is connected with a high concentration region 40 of the same conductivity type as the substrate in a plate region 55. Other structural elements are similar to those of the first embodiment, and further description thereof will be omitted.

Figure 7:
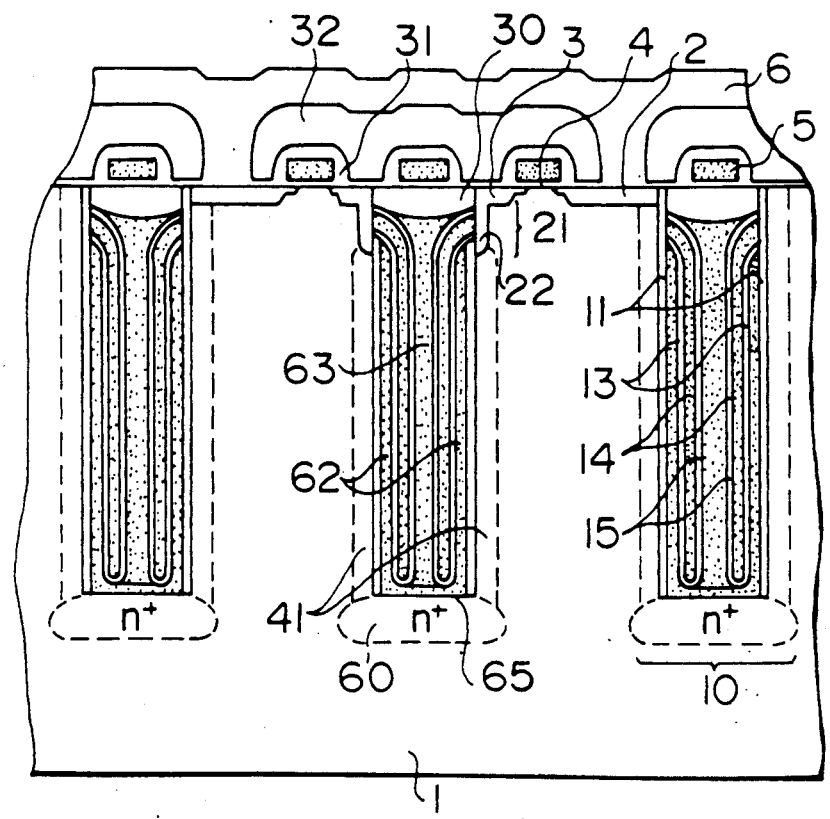
FIG. 7 is a schematic cross section view of a unit cell showing a third embodiment of the present invention.

FIG. 7 shows a schematic cross section structure of an unit memory cell showing a third embodiment of the present invention. Reference numeral 60 denotes an impurity layer opposite in conductivity type to the substrate 1; 62, a cell plate electrode of the same conductivity type as the impurity layer 60 and of poly-silicon in which impurities are diffused; and 63, a cell plate electrode of poly-silicon in which impurities of the same conductivity type as the impurity layer 60 are diffused. The cell plate electrode 62 is connected with the impurity layer 60 in a plate contact area 65. Other structural elements are similar to those of the first embodiment and further description thereof will be omitted.

As described above, according to the present invention, a capacitor and an insulating isolation region of a memory cell are formed in the trench formed around the switching transistor. In the capacitor, the storage electrode is sandwiched between the upper and lower cell plate electrodes. Thus, the following advantages are considered:

(1) Since the periphery of the switching transistor is completely separated by the insulator buried in the trench, a leak current due to parasitic MOS transistor effect on the trench sidewall along the channel is suppressed.

(2) Since the storage electrode is sandwiched between the cell plate electrodes, it is the cell plate fixed to a constant voltage (0 V or $\frac{1}{2}$ Vcc) which opposes the trench sidewall. In addition, the impurity layer of higher concentration than the substrate and of the same conductive type as the substrate is formed in the trench sidewall to thereby render difficult depletion of charge-carriers in the sidewall. Thus, a leak current due to the gate controlled diode structure of the source and trench sidewall of the switching transistor is suppressed.

(3) The sandwich structure in which the storage electrode is held between the upper and lower cell plate electrodes serves to increase the cell capacitance.

(4) Since signal charges are stored between the poly-silicon storage electrode and the respective cell plate electrodes in the trench, they are resistant to a soft error due to α-particles.

(5) In the first and third embodiments, any external bias voltage is applicable to the cell plate electrodes, to realize a $\frac{1}{2}$ Vcc cell plate voltage.

Figure 8A:
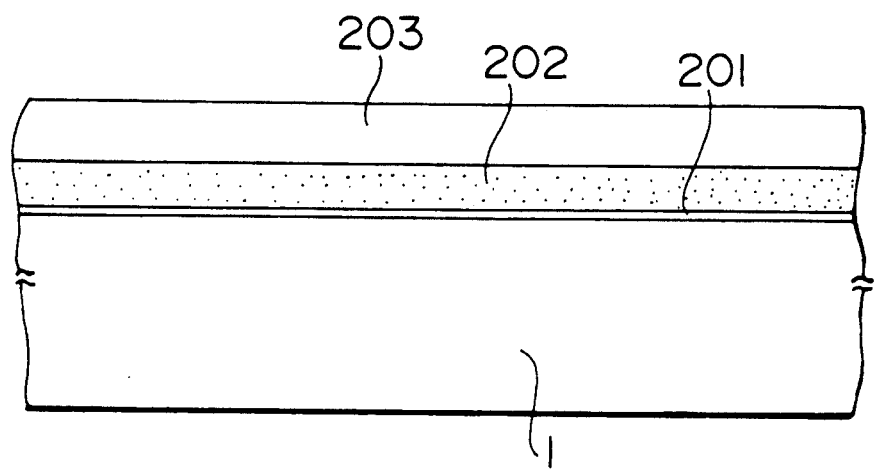
FIG. 8(a)–(h) are a cross section view of the first embodiment of the present invention, showing the corresponding process of its manufacturing method.
Figure 8B:
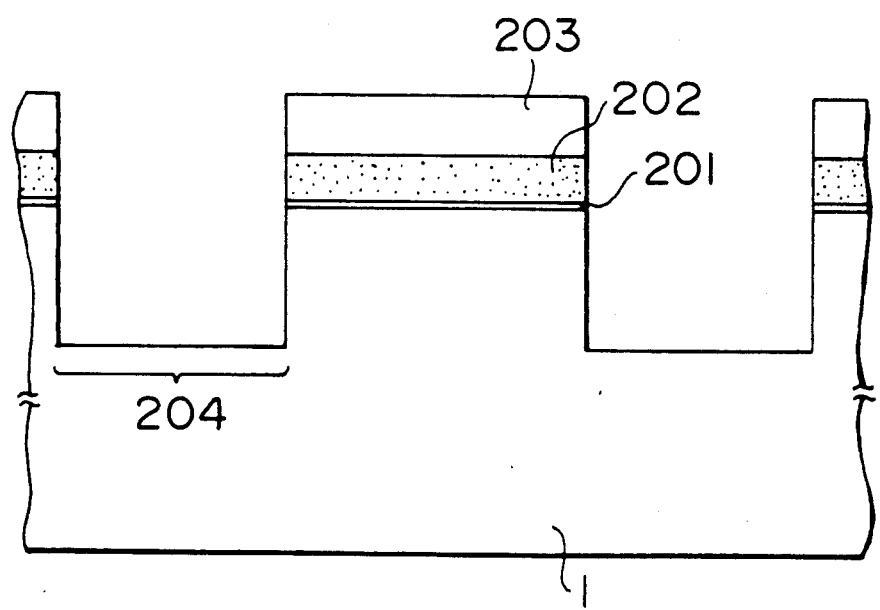
Figure 8C:
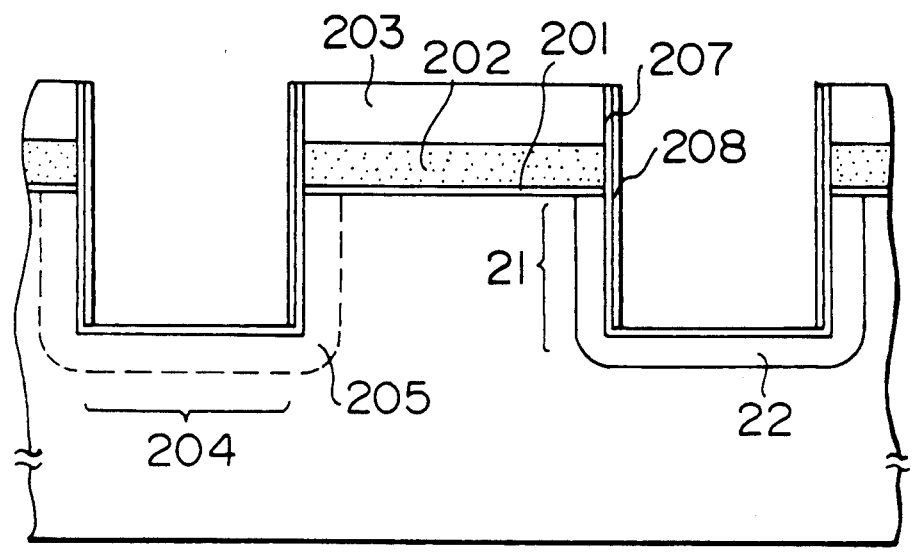
Figure 8D:
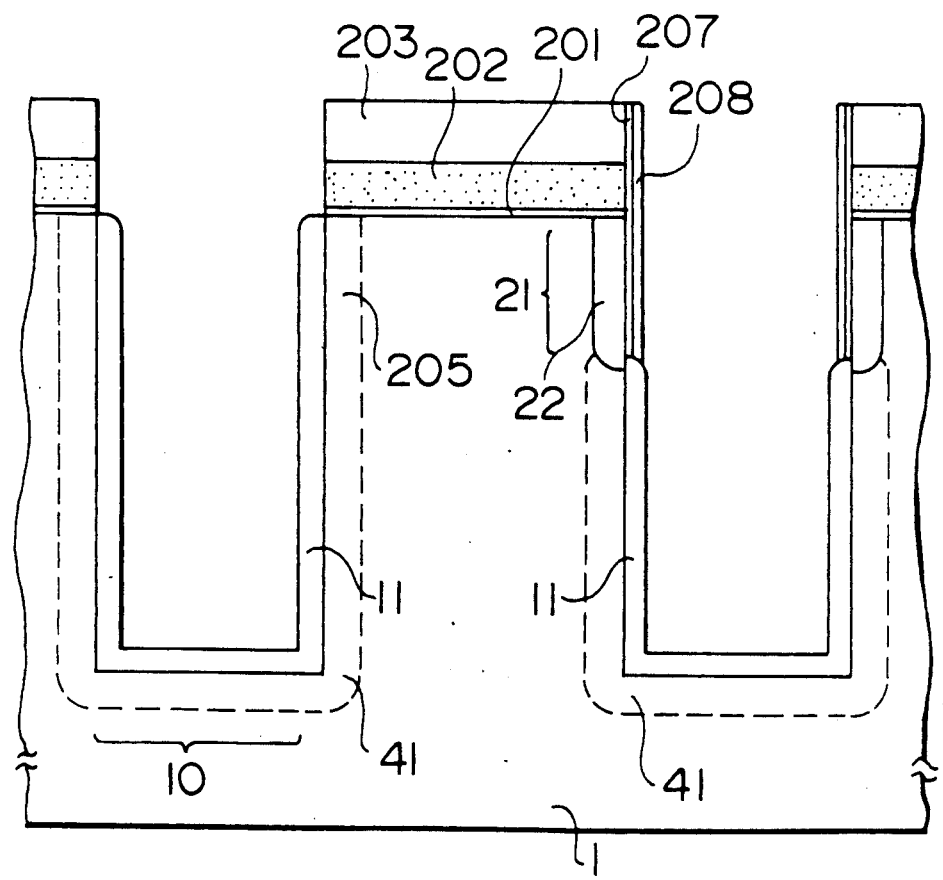
Figure 8E:
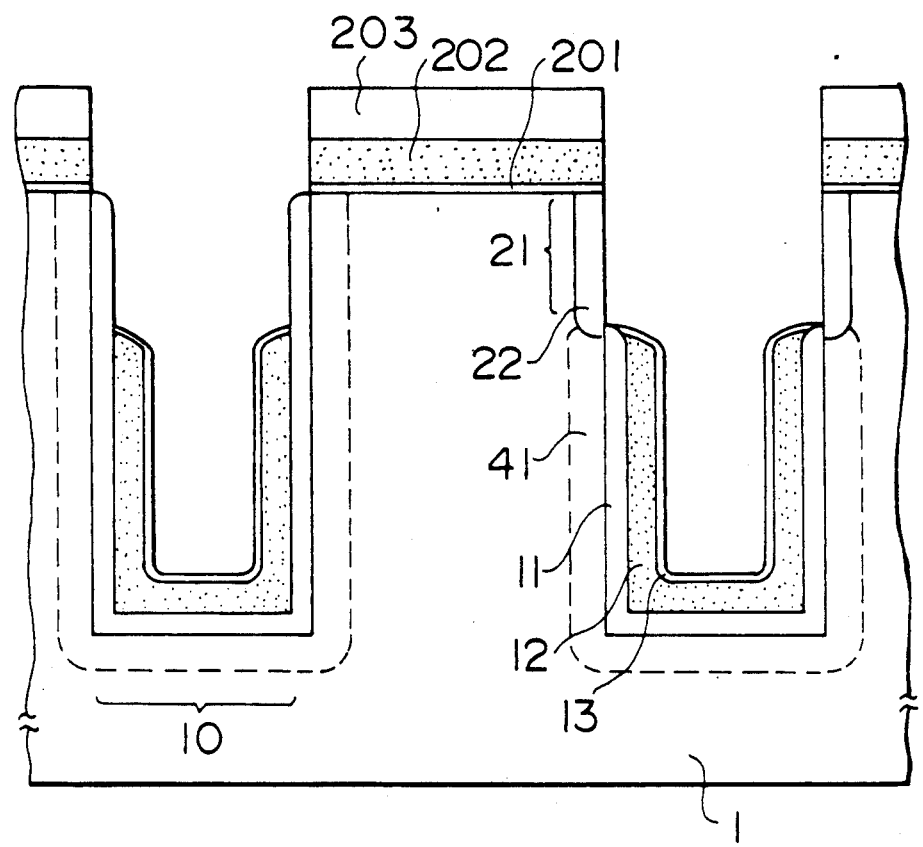
Figure 8F:
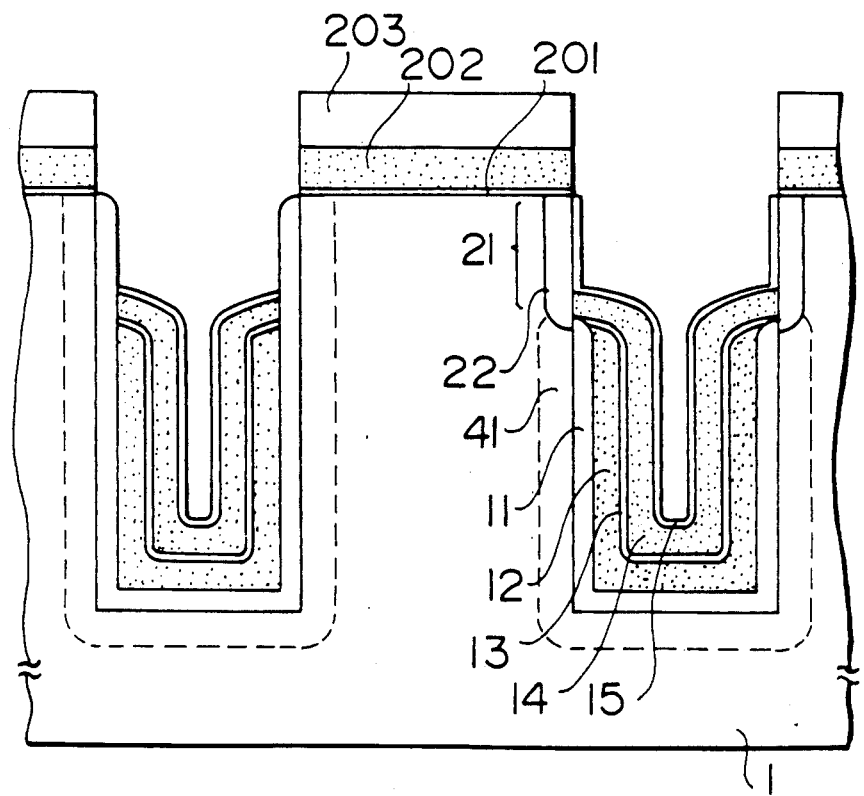
Figure 8G:
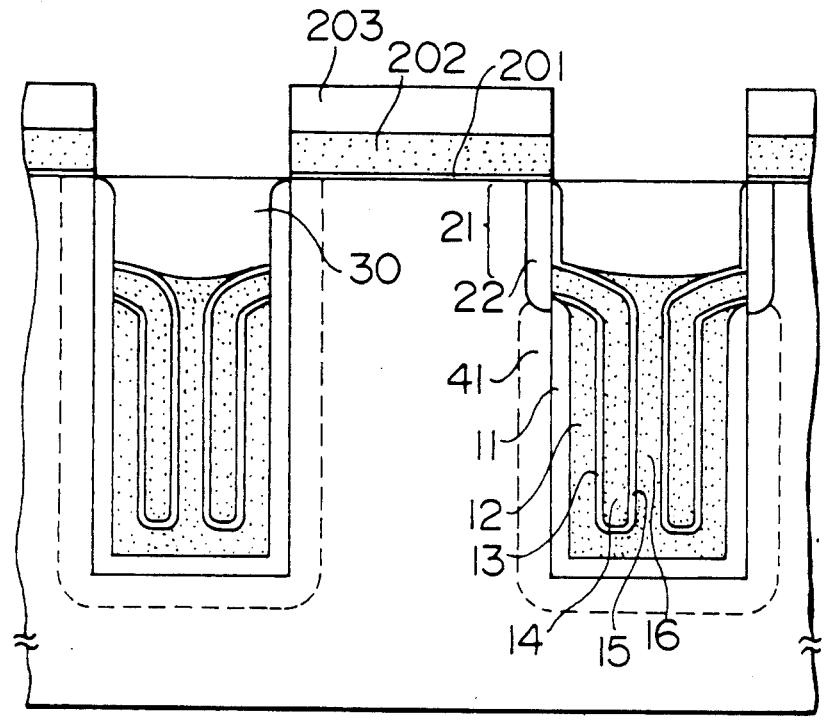
Figure 8H:
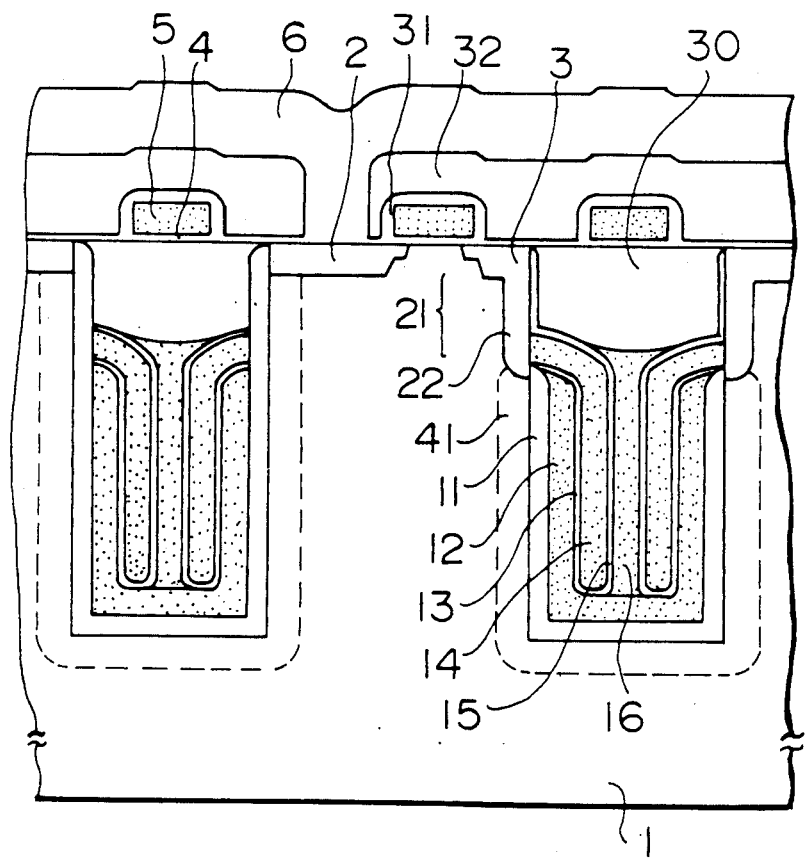

The method of manufacturing the first embodiment of the present invention will be described with reference to FIG. 8. FIG. 8(a)–(b) are a cross section view of a memory cell, showing the corresponding process of its manufacturing method.

In FIG. 8(a), a silicon oxide film 201 is formed about 50 μm thick on a p-type silicon substrate 1, and PSG 203 is deposited about 1000 μm thick on the poly-silicon layer 202 (step (a)).

The PSG 203, poly-silicon 202 and oxide film 201 are etched using a photoresist pattern as a mask. The photoresist is then removed, and the silicon substrate 1 is selectively etched using the PSG 203 as a mask to form an insulating shallow isolation trench 203 (which is about 1 μm deep) (step (b)).

A $p^+$-type channel stop 205 is formed in the insulating isolation area forming the switching transistor using a photoresist pattern as a mask. Similarly, $As^+$ ions are implanted using a photoresist pattern as a mask to form an $n^+$-layer 22 in the contact region 21 with the storage electrode. The inner surface of the trench 204 is oxided up to 20–50 μm deep to deposit a silicon oxide film 207 and further a silicon nitride film 208 so as to be 50–100 μm thick thereon. The silicon nitride film 208 is left only on the sidewall of the trench by reactive ion etching (step (c)).

The silicon oxide film 207 and the underlying silicon substrate are subjected to reactive ion etching to form a trench 10 which is 3-4 μm deep from the substrate surface. When the deep trench 10 is etched, the PSG film 203 functions as a mask. A p+-layer 41 is formed on the sidewall and bottom of the trench 10 to suppress the inversion of the conductivity type of the substrate on the trench sidewall. The deep trench sidewall is then thermally oxidized to form a silicon oxide film 11 which is about 100 μm thick on the inner surface of the trench. The contact area sidewall 21 covered with the silicon nitride film 208 is not oxidized at all (step (d)).

The silicon nitride film 208 is then removed using isotropic plasma etching or a hot phosphoric acid, and the silicon oxide film 207 is removed using a hydrofluoric acid solution. A poly-silicon film including phosphorus is deposited about 100 μm thick on the inside of the trench. A photoresist is coated and then buried in the trench by etch-back, and the poly-silicon is then subjected to reactive ion etching to form a first cell plate electrode 12. A first capacitor insulating film 13 of an oxide film or an oxide film-nitride film is formed on the first cell plate electrode 12 (step (e)).

A poly-silicon film including phosphorus is deposited about 100 μm thick within the trench, a photoresist is coated and buried within the trench by etch-back, and the poly-silicon is subjected to reactive ion etching to form a stroage electrode 14, which is then connected with a contact node 22 in the contact area 21. A second capacitor insulating film 15 of an oxide film or an oxide film-nitride film is formed on the storage electrode 14 (step (f)).

The capacitor insulating film 15, storage electrode 14 and capacitor insulating film 13 at the trench bottom are subjected to reactive ion etching to separate the storage electrode 14 in the trench. The same capacitor insulating film as the film 15 on the storage electrode 14 and removed by the reactive ion etching is again formed. A poly-silicon film including phosphorus is then deposited, a photoresist is coated and buried in the trench by etch-back, and a second cell plate electrode 16 is formed by the reactive ion etching of the poly-silicon. The first and second cell plate electrodes 12 and 16 are connected at the trench bottom. A separation area is formed by burying an insulating 30 in the trench (step (g)).

The PSG 203, poly-silicon 202, silicon oxide 201 are then removed to form the switching transistor using regular processes (step (h)).

Figure 9D:
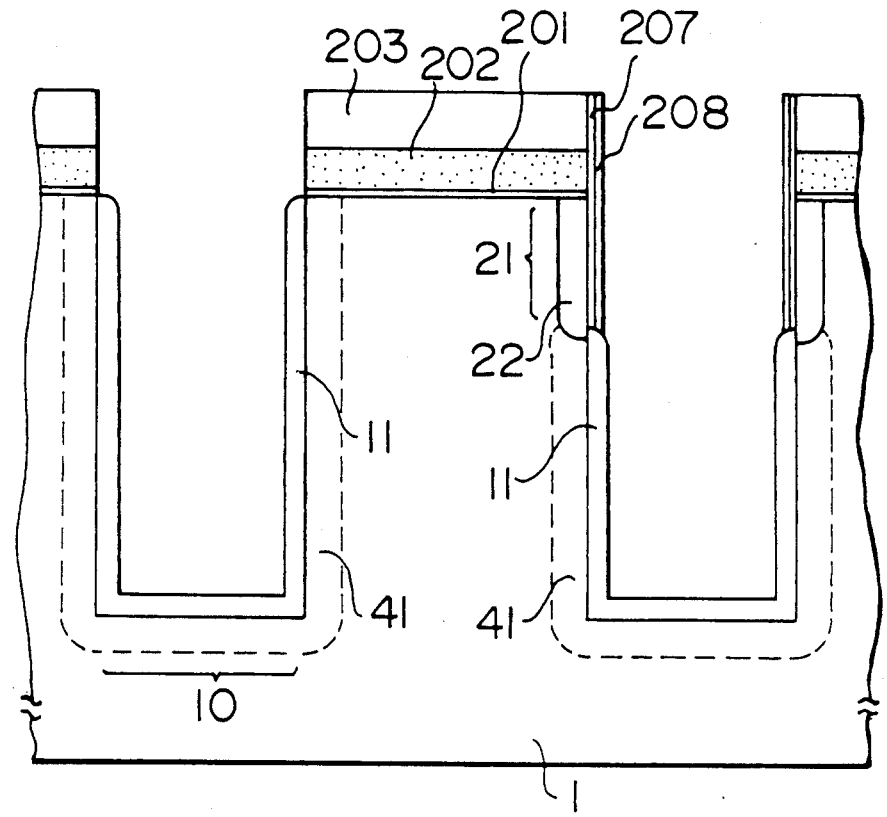
FIG. 9(d) and (d)' are a cross section view of the second embodiment of the present invention, showing the corresponding process of its manufacturing method.
Figure 9D:
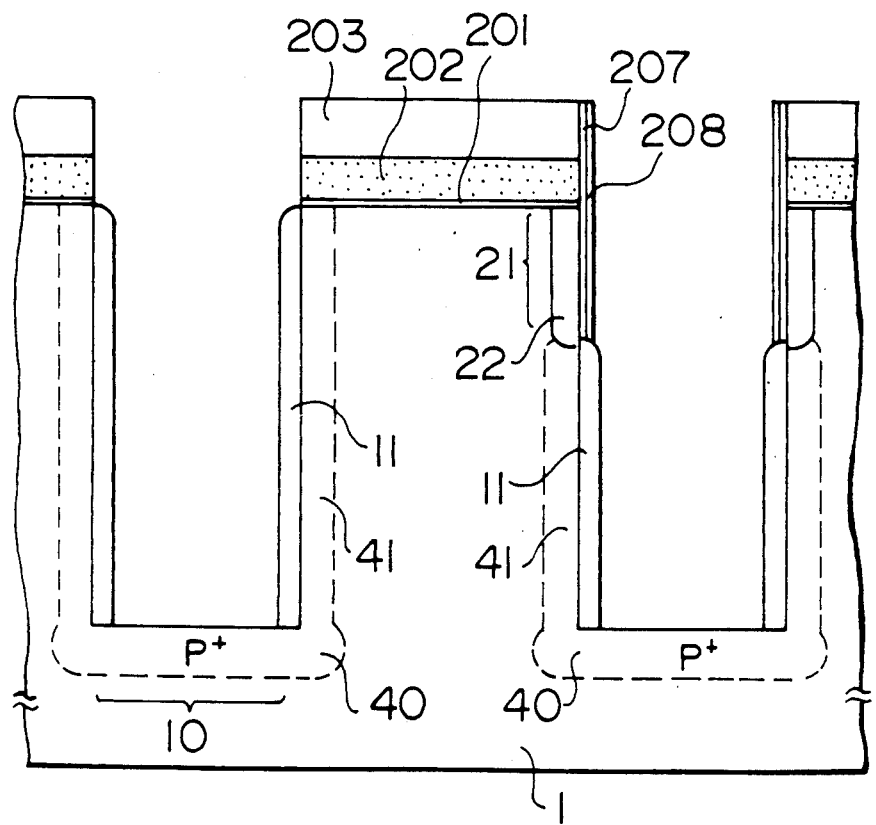

FIG. 9(d)-(d)' show a cross section view of a second embodiment of the present invention, showing the corresponding process of the method of manufacturing the second embodiment. Up to the process step (d), the steps are the same as those of the method of manufacturing the first embodiment, and further description thereof will be omitted. At a process step (d)', the silicon oxide film 11 at the trench bottom is eliminated by reactive ion etching to expose the silicon substrate. Boron is then iron-implanted into trench bottom to form a p+-layer 40 (process step (d)'). The p+-layer 40 is connected with the first cell plate in a later process.

The subsequent processes are the same as those of the method of manufacturing the first embodiment and further description thereof will be omitted.

Figure 10D:
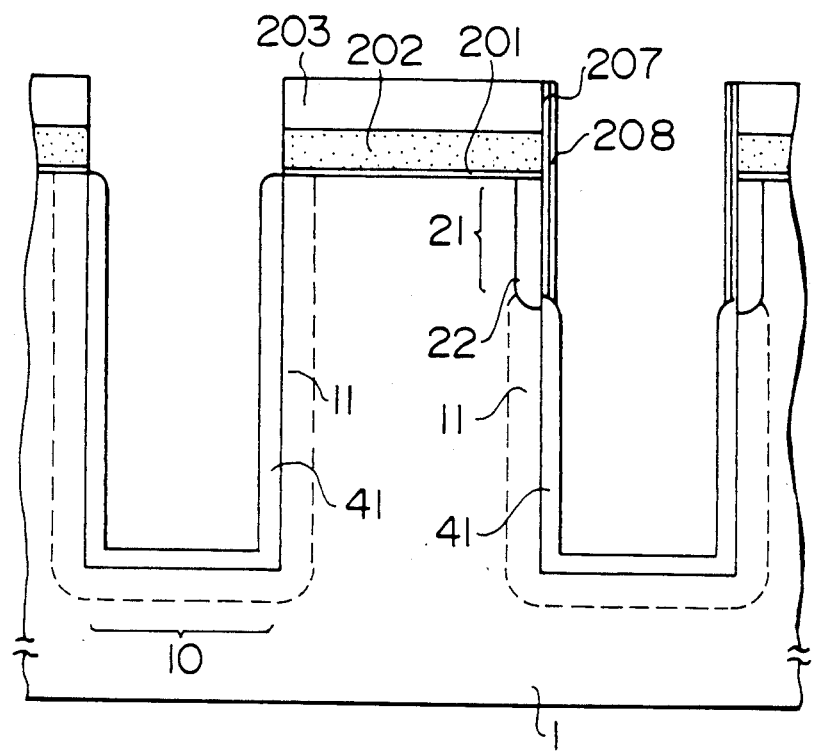
FIG. 10(d) and (d)'' are a cross section view of the third embodiment of the present invention, showing the corresponding process of its manufacturing method.
Figure 10D:
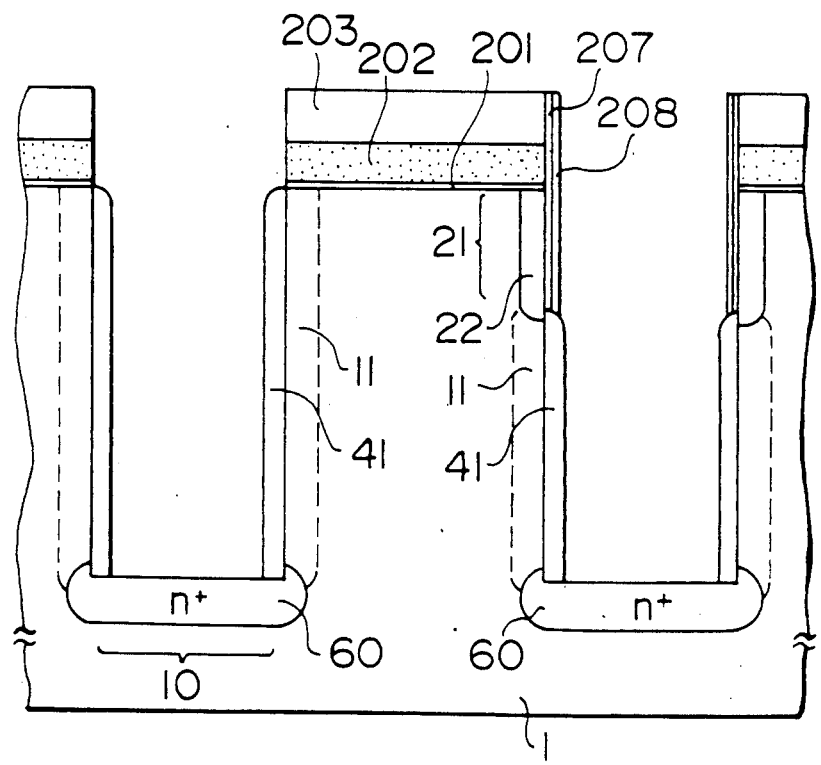

FIGS. 10(d)-(d)" are a cross section view of a third embodiment of the present invention, showing the corresponding process of the method of manufacturing the third embodiment. Up to the process step (d) are the same as those of the method of manufacturing the first embodiment and further description thereof will be omitted. In the process step (d)", the silicon oxide film 11 at the trench bottom is removed by reactive ion etching to expose the silicon substrate. As+ ions are implanted into the trench bottom to form an n+-layer 60 (process step (d)"). The n+-layer 60 is connected with the first cell plate electrode in a later step. The subsequent processes are the same as those of the method of manufacturing the first embodiment and further description thereof will be omitted.

We claim:

1. A semiconductor memory device comprising:
   a semiconductor substrate including a plurality of trenches formed therein;
   an insulating film formed on a bottom and a sidewall of at least one of said trenches;
   a first cell plate electrode provided in said one of said trenches;
   a first capacitor insulating film formed on said first cell plate electrode;
   a storage electrode formed on said first capacitor insulating film, said storage electrode being connected with a source area of a switching transistor of a unit cell of said memory device which is separated electrically from an adjacent unit cell of said memory device;
   a second capacitor insulating film formed on said storage electrode; and
   a second cell plate electrode formed on said second capacitor insulating film, said first and second cell plate electrodes being connected with each other and supplied with a given bias voltage from an external circuit;
   wherein said insulating film formed on said at least one of said trenches and said first and second capacitor insulating films provide an element separating area whereby the unit cell disposed in said one of said trenches is electrically isolated from an adjacent unit cell disposed in an adjacent one of said trenches, the switching transistor being formed in an island surrounded by said at least one of said trenches.

2. A semiconductor memory device according to claim 1, wherein the first and second cell plate electrodes are made of a semiconductor layer of the same conductivity type as that of the semiconductor substrate and are connected with the semiconductor substrate at said bottom of said one of said trenches.

3. A semiconductor memory device according to claim 1, wherein the first and second cell plate electrodes are made of a semiconductor layer opposite in conductivity type to that of the semiconductor substrate, and an impurity diffusion layer of the same conductivity type as that of the semiconductor layer of the first and second cell plate electrodes is provided on the semiconductor substrate at a position where said insulating film is removed from said bottom of said one of said trenches, the first and second cell plate electrodes being connected with the impurity diffusion layer at the bottom of said one of said trenches and being supplied with said given bias voltage from said external circuit through the impurity diffusion layer.

4. A semiconductor memory device comprising:
   a semiconductor substrate having a plurality of trenches formed therein;
   an insulating film formed on a bottom and a sidewall of at least one of said trenches;

a first cell plate electrode provided in said one of said trenches;

a first capacitor insulating film formed on said first cell plate electrode;

a storage electrode formed on said first capacitor insulating film, said storage electrode being connected with a source area of a switching transistor of a unit cell of said memory device;

a second capacitor insulating film formed on said storage electrode; and a second cell plate electrode formed on said second capacitor insulating film, said first and second cell plate electrodes being connected with each other and supplied with a given bias voltage from an external circuit.

* * * * *